US006823500B1

(12) United States Patent
Ganesh et al.

(10) Patent No.: US 6,823,500 B1
(45) Date of Patent: Nov. 23, 2004

(54) 2-DIMENSIONAL PLACEMENT WITH RELIABILITY CONSTRAINTS FOR VLSI DESIGN

(75) Inventors: Kiran Ganesh, Mountain View, CA (US); Artour Levin, San Jose, CA (US); Miles F. McCoo, Haifa (IL); Naresh K. Sehgal, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/431,477

(22) Filed: Nov. 1, 1999

(51) Int. Cl.[7] .............................................. G06F 17/50
(52) U.S. Cl. .................................. 716/9; 716/10; 716/4
(58) Field of Search ................................ 716/9, 10, 4

(56) References Cited

U.S. PATENT DOCUMENTS

| | | | | |
|---|---|---|---|---|
| 5,581,475 A | * | 12/1996 | Majors ........................ | 716/10 |
| 5,648,910 A | * | 7/1997 | Ito ............................... | 716/2 |
| 5,675,501 A | * | 10/1997 | Aoki ............................ | 716/8 |
| 5,737,236 A | * | 4/1998 | Maziasz et al. .............. | 716/8 |
| 5,737,580 A | * | 4/1998 | Hathaway et al. ............ | 716/12 |
| 5,801,960 A | * | 9/1998 | Takano et al. ................ | 716/10 |
| 5,817,574 A | * | 10/1998 | Gardner ....................... | 438/637 |
| 5,995,734 A | * | 11/1999 | Saika ........................... | 716/9 |
| 6,038,383 A | * | 3/2000 | Young et al. .................. | 716/5 |
| 6,077,308 A | * | 6/2000 | Carter et al. .................. | 716/8 |
| 6,163,877 A | * | 12/2000 | Gupta .......................... | 716/8 |
| 6,189,131 B1 | * | 2/2001 | Graef et al. ................... | 716/8 |
| 6,242,807 B1 | * | 6/2001 | Kazami ....................... | 257/758 |
| 6,253,361 B1 | * | 6/2001 | Buch ............................ | 716/6 |
| 6,286,128 B1 | * | 9/2001 | Pileggi et al. ................. | 716/18 |
| 6,308,302 B1 | * | 10/2001 | Hathaway et al. ............ | 716/5 |
| 6,308,303 B1 | * | 10/2001 | Mysore et al. ................ | 716/5 |
| 6,543,041 B1 | * | 4/2003 | Scheffer et al. ............... | 716/10 |

OTHER PUBLICATIONS

Aipperspach et al. "A 0.2–/spl mu/m, 1.8V, SOI, 550–MHZ, 64–b PowerPC Micropocessor with Copper Interconnects", IEEE Journal of Solid–State Circuits, vol. 34, No. 11, Feb. 15, 1999, pp. 1430–1435.*

Malinoski et al., "A test site thermal control system for at–speed manufacturing testing", Proceedings of the 1998 International Test Conference, Oct. 18, 1998, pp. 119–128.*

Gupta et al. ("Optimal 2–D cell layout with integrated transistor folding", 1998 IEEE/ACM International Conference on Computer–Aided Design, Nov. 8, 1998, pp. 128–135.*

Frost et al. ("RELIANT: a reliability analysis tool for VLSI interconnects", Proceedings of the IEEE 1988 Custom Integrated Circuits Conference, May 16, 1988, pp. 27.8/1–27.8/4).*

(List continued on next page.)

Primary Examiner—Vuthe Siek
Assistant Examiner—Phallaka Kik
(74) Attorney, Agent, or Firm—Schwegman, Lundberg, Woessner & Kluth, P.A.

(57) ABSTRACT

A 2-dimensional placement system and method minimize reliability concerns arising from electromigration and self-heat while at the same time achieving a high layout density. The 2-dimensional placement method also uses a placement space with rows that have non-uniform sizes and are overlapping. According to one embodiment of the present invention, a computerized method of creating a layout for a circuit design includes receiving a circuit design and receiving at least one layout rule based on a reliability verification constraint for the circuit design. The computerized method further includes generating a layout for the circuit design through computer automated operations wherein the layout generated satisfies the at least one layout rule based on the reliability verification constraint received for the circuit design.

26 Claims, 14 Drawing Sheets

OTHER PUBLICATIONS

Liew et al. ("Circuit reliability simulator for interconnect, via, and contact electromigration", IEEE Transactions on Electron Devices, vol. 39, No. 11, Nov. 1992, pp. 2472–2479).*

Teng et al. ("iTEM: a temperature–dependent electromigration reliability diagnosis tool", IEEE Transactions on Computer–Aided Design of Integrated Circuits and Systems, vol. 16, No. 8, Aug. 1997, pp. 882–893).*

Surkan ("Design for a Network–Based Education System that Evolves by Peer and Instructor Interaction", 1998 Proceedings of IEEE International Symposium on Defect and Fault Tolerance in VLSI Systems, Nov. 2, 1998, pp. 275–279).*

Chowdhury et al. ("Optimum design of IC power/ground nets subject to reliability constraints", IEEE Transactions on Computer–Aided Design of Integrated Circuits and Systems, vol. 7, No. 7, Jul. 1988, pp. 787–796).*

Dalal et al. ("Design of an efficient power distribution network for the UltraSPARC01 microprocessor", Proceedings of 1995 IEEE International Conference on Computer Design: VLSI in Computers and Processors, Oct. 2, 1995, pp. 118–123).*

Wolf et al. ("Reliability driven module generation for analog layouts", Proceedings of the 1999 IEEE International Symposium on Circuits and Systems, vol. 6, May 30, 1999, pp. 412–415.*

Van Genneken et al. ("Doubly folded transistor matrix layout", IEEE International Conference on Computer–Aided Design, Nov. 7, 1988, pp. 134–137).*

Her et al. ("Cell area minimization by transistor folding", Proceedings of European Design Automation Conference, Sep. 20, 1993, pp. 172–177).*

Gupta et al. ("XPRESS: a cell layout generator with integrated transistor folding", Proceedings of European Design and Test Conference, Mar. 11, 1996, pp. 393–400.*

Kim et al. ("An Efficient Transistor Folding Algorithm For Row–based CMOS Layout Design", Proceedings of the 34th Design Automation Conference, Jun. 9, 1997, pp. 456–459).*

Basaran, B., et al., "GeneSys: A Leaf–Cell Layout Synthesis System for GHz VLSI Designs", *Proceedings of the 12th International Conference on VLSI Design*, 448–452, (Jan. 1999).

Gupta, A., et al., "CLIP: An Optimizing Layout Generator for Two–Dimensional CMOS Cells", *Proceedings fo the 34th Design Automation Conference*, 452–455, (Jun. 1997).

Gupta, A., et al., "Near–Optimum Hierarchical Layout Synthesis of Two–Dimensional CMOS Cells", *Proceedings of the 12th International Conference on VLSI Design*, 453–459, (Jan. 1999).

Gupta, A., et al., "Width Minimization of Two–Dimensional CMOS Cells Using Integer Programming", *Proceedings of the IEEE/ACM International Conference on CAD*, 660–667, (1996).

Ho, J., et al., "New Algorithms for the Rectilinear Steiner Tree Problem", *IEEE Transactions on Computer–Aided Design*, vol. 9, 185–193, (Feb. 1990).

Hsieh, Y., et al., "LiB: A CMOS Cell Compiler", *IEEE Transactions on Computer–Aided Design*, vol. 10, 994–1005, (Aug. 1991).

Hu, C., et al., "Electromigration Under Bidirectional Current Stress", *Proceedings of the Symposium on Reliability of Metals in Electronics*, 188–202, (1995).

Hwang, C.Y., et al., "An Efficient Layout Style for Two–Metal CMOS Leaf Cells and Its Automatic Synthesis", *IEEE Transactions on Computer–Aided Design of Integrated Circuits and Systems*, vol. 12, 410–424, (Mar. 1993).

Riepe, M.A., et al., "Transistor Level Micro Placement and Routing for Two–Dimensional Digital VLSI Cell Synthesis", *Technical Report CSE–TR–364–98, The University of Michigan, Ann Arbor*, 1–18, (Jun. 1998).

Romeo, F., et al., "Research on Simulated Annealing at Berkeley", *Proceedings of the IEEE International Conference on Computer Design: VLSI in Computers*, 652–657, (Oct. 1984).

Saika, S. et al., "A Two–Dimensional Transistor Placement Algorithm for Cell Synthesis and Its Application to Standard Cells", *IEICE Transactions on Fundamentals of Electronics, Communications and Computer Sciences*, vol. E80–A, 1883–1891, (Oct. 1997).

Tani, K., et al., "Two–Dimensional Layout Synthesis for Large–Scale CMOS Circuits", *IEEE International Conference on Computer–Aided Design*, 490–493, (Nov. 1991).

Wimer, S., et al., "Optimal Chaining of CMOS Transistors in a Functional Cell", *IEEE Transactions on Computer–Aided Design*, vol. CAD–6, 795–801, (Sep. 1987).

* cited by examiner

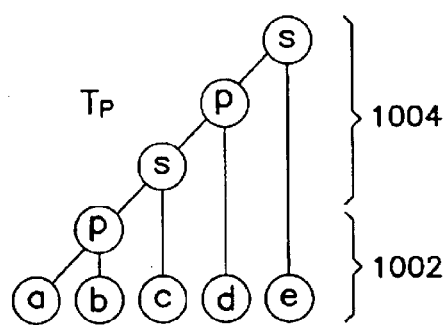
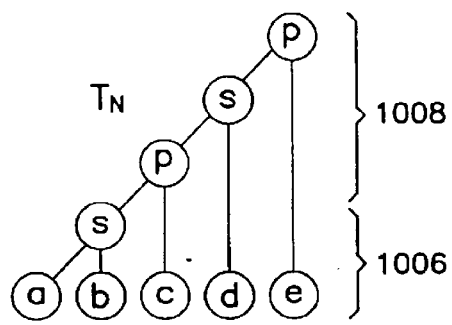
FIG. 10A  FIG. 10B
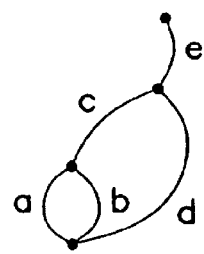
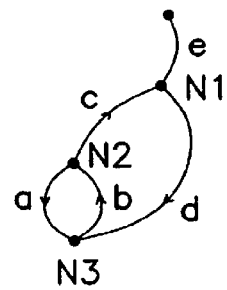
FIG. 11A  FIG. 11B ⊠ STRAPS ON NET n1
☐ STRAPS ON OTHER NETS

2-DIMENSIONAL PLACEMENT WITH RELIABILITY CONSTRAINTS FOR VLSI DESIGN

FIELD OF THE INVENTION

The present invention is related to computer-aided design, and more particularly to a computer-aided design placement tool for performing 2-dimensional transistor placement with emphasis on reliability verification constraints in integrated circuit layout.

BACKGROUND INFORMATION

Integrated circuits comprise a collection of components, including but not limited to transistors, resistors, and capacitors, fabricated on a semiconductor substrate. The components are connected with metal interconnections, called wires, to form a system such as a microprocessor. Integrated circuit performance has been improving because the components and the wires are being fabricated in smaller sizes to increase the density of the integrated circuits. However, keeping the correct functionality of an integrated circuit intact over extended periods of usage and preventing breakdowns are new concerns that designers and computer-aided design tools need to address for circuit designs.

Circuits that function properly when fabricated often fail to work after a certain period of use. Such failures are caused by various reliability phenomena. Electromigration is a common reliability phenomenon that affects high-frequency circuits today. Electromigration refers to the migration of metal ions due to prolonged electron flow in the same direction. Electromigration causes progressive damage to metal conductors in an integrated circuit. Electromigration results in the creation of voids and hillocks in the metal interconnections, as a result of which the effective cross-section of the conductor comes down. Over time, the metal width of the interconnection is no longer sufficient to carry the current and this causes electrical opens or increased resistance which lead to circuit failure. FIGS. 1A and 1B are diagrams of a top view of a wire illustrating the effects of electromigration. As shown in FIG. 1A, a wire unaffected by electromigration has a uniform width. However, a wire having a high unidirectional current density experiences electromigration over a period of use. As shown in FIG. 1B, the width of the wire is no longer uniform due to electromigration.

Another reliability phenomenon is the self-heat of metal wires. Self-heat refers to the thermal breakdown of a conductor, very similar to how a filament in a bulb burns out. FIGS. 2A and 2B are diagrams of a top view of a wire illustrating the effects of self-heat. As shown in FIG. 2A, a wire unaffected by self-heat has a uniform width. However, a wire having a high density current experiences self-heat over a period of use. As shown in FIG. 2B, a wire affected by self-heat breaks down and is no longer uniform.

Both of these problems are caused by large currents in interconnections that are not wide enough to handle them. In any modern high-frequency integrated circuit, interconnections have to be sized based on these reliability concerns. With microprocessor designs now entering the GHz frequency ranges, it is extremely critical to optimize their design layouts for reliability verification (RV) constraints. But optimizing layouts by hand for reliability verification constraints affects a mask-designer's productivity because the amount of layout rework involved can be quite significant. However, currently available automated placement algorithms do not consider reliability verification issues.

Accordingly, there is a need for an automated design tool that minimizes reliability concerns arising from electromigration and self heat, while at the same time achieves a high layout density.

SUMMARY OF THE INVENTION

According to one embodiment of the present invention, a computerized method of creating a layout for a circuit design includes receiving a circuit design and receiving at least one layout rule based on a reliability verification constraint for the circuit design. The computerized method further includes generating a layout for the circuit design through computer automated operations wherein the layout generated satisfies the at least one layout rule based on the reliability verification constraint received for the circuit design.

Other embodiments are described and claimed.

BRIEF DESCRIPTION OF THE DRAWINGS

FIGS. 10A and 10B are structural trees for the N- and P-parts of the cluster shown in FIG. 9.

FIG. 11A is a diffusion graph for the P-parts of the cluster shown in FIG. 9.

FIG. 11B is the diffusion graph of FIG. 11A with arrows on the edges to indicate a path.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

The embodiments of a novel 2-dimensional placement system and method described below minimize reliability concerns arising from electromigration and self-heat while at the same time achieving a high layout density. In one embodiment, the 2-dimensional placement method is useful in placing circuits containing widely varying transistor sizes. Some embodiments of the present invention are used for synthesis of standard cells, datapath bit-cells or custom cells.

The phrase "some embodiments" refers to at least some embodiments of the invention. The various appearances of "some embodiments" are not necessarily referring to the same embodiments. If the specification states a component, feature, structure, or characteristic "may," "might," or "could" be included, that particular component, feature, structure, or characteristic is not required to be included. Reference in the specification to "an embodiment" or "one embodiment" means that a particular feature, structure, or characteristic described in connection with the embodiment is included in at least some embodiments, but not necessarily all embodiments, of the invention.

Hardware and Operating Environment

Figure 1A:
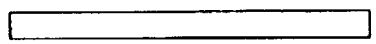
FIGS. 1A and 1B are diagrams of a top view of a wire illustrating the effects of electromigration.
Figure 1B:
Figure 2A:
FIGS. 2A and 2B are diagrams of a top view of a wire illustrating the effects of self-heat.
Figure 2B:
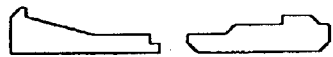
Figure 3:
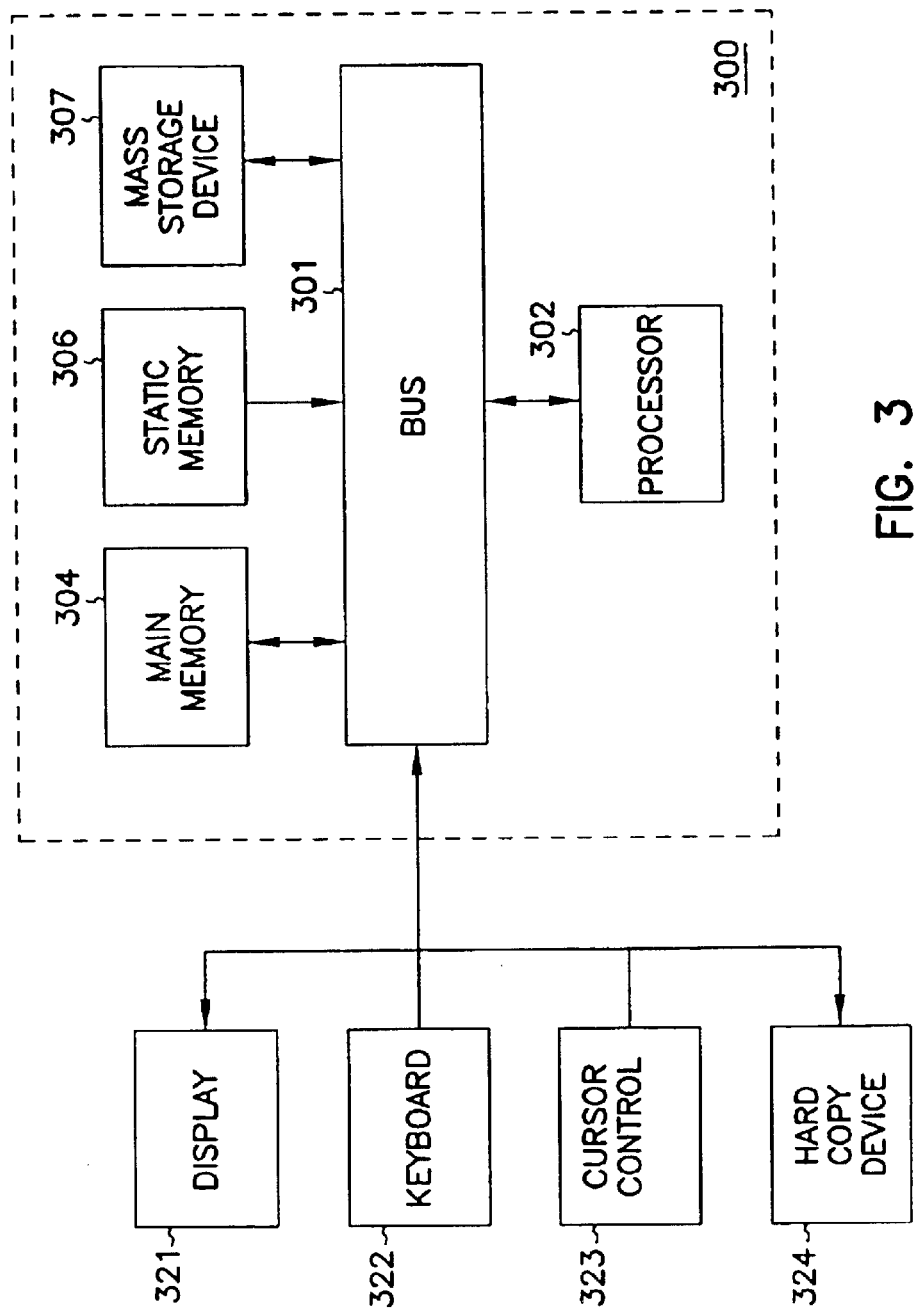
FIG. 3 is a diagram of a typical hardware and operating environment in conjunction with which embodiments of the invention may be implemented.

FIG. 3 is a diagram of a typical hardware and operating environment in conjunction with which embodiments of the invention are implemented. Computer system 300 comprises a bus or other communication means 301 for communicating information, and a processor 302 coupled with bus 301 for processing information. Computer system 300 further comprises a random access memory (RAM) or other dynamic storage device 304 (referred to as main memory), coupled to bus 301 for storing information and instructions to be executed by processor 302. Main memory 304 also may be used for storing temporary variables or other intermediate information during execution of automated placement tool instructions by processor 302. Computer system 300 also comprises a read only memory (ROM) and/or other static storage device 306 coupled to bus 301 for storing static information and instructions for processor 302, and a data storage device 307 such as a magnetic disk or optical disk and its corresponding disk drive. Data storage device 307 is coupled to bus 301 for storing information and instructions for creating a layout for a circuit design. Computer system 300 may further be coupled to a display device 321, such as a cathode ray tube (CRT) or liquid crystal display (LCD) coupled to bus 301 for displaying design placement information to a computer user. An alphanumeric input device 322, including alphanumeric and other keys, may also be coupled to bus 301 for communicating information and command selections to processor 302. An additional user input device may be cursor control device 323, such as a mouse, trackball, stylus, or cursor direction keys, coupled to bus 301 for communicating direction information and command selections to processor 302, and for controlling cursor movement on display 321. Another device which may be coupled to bus 301 is hard copy device 324 which may be used for printing instructions, data, or other information on a medium such as paper, film, or similar types of media. Note, also, that any or all of the components of computer system 300 and associated hardware may be used in one embodiment, however, it can be appreciated that any type of configuration of the system may be used for various purposes as the user requires in other embodiments.

Computer-readable instructions stored on a computer-readable medium are executable by the processor 302 of computer system 300. A hard drive, CD-ROM, and RAM are some examples of articles including a computer-readable medium. For example, a computer-aided design tool performing reliability verification may be included on a CD-ROM and loaded from the CD-ROM to a hard drive. The computer-readable instructions cause the computer system 300 to perform methods of creating a layout for a circuit design as further described below.

System Level Overview

Computer-aided design tools are used to automated the design of integrated circuits. Several different types of computer-aided design tools are available, including but not limited to, schematic design tools, net list tools, placement tools and routing tools. A placement tool is used to locate the components of a circuit design for an integrated circuit in a physical layout for the integrated circuit. The placement tool receives as input the circuit design and various layout architecture rules and produces layouts that conform to those rules. The novel placement tool of the present invention receives at least one layout rule based on reliability verification constraints and generates a layout that conforms to the layout rules.

Reliability verification constraints refer to constraints arising from any phenomena that lead to the gradual malfunctioning of a chip. Such phenomena cause chips that function properly when manufactured to develop problems over certain periods of usage. Two examples of such phenomena are electromigration and self-heat.

Figure 4:
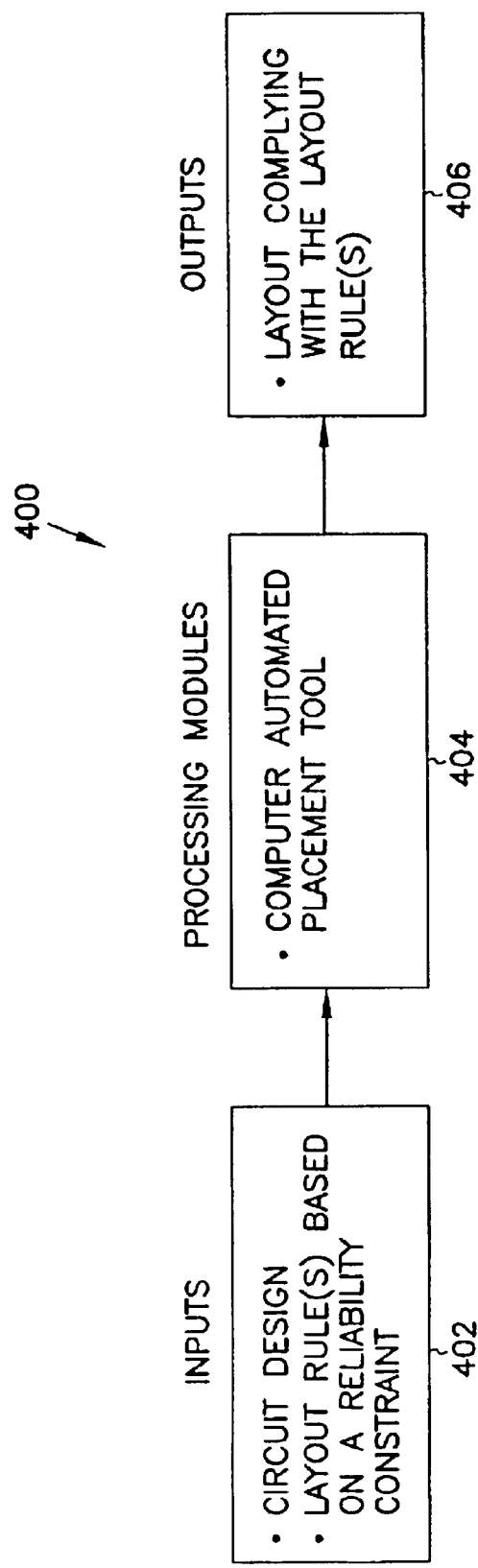
FIG. 4 is a block diagram of one embodiment of a computer automated placement tool of the present invention.

A system level overview of one embodiment of the present invention is described by reference to FIG. 4. FIG. 4 is a block diagram of a computer automated placement system 400. The computer automated placement system shown in FIG. 4 comprises inputs 402, processing modules 404, and one or more outputs 406.

In one embodiment, the inputs 402 comprise a circuit design for an integrated circuit and one or more layout rules based on reliability verification constraints. The circuit design is created using any commonly available schematic design tool software. A net list representation of the circuit design is created using any commonly available net list tool software.

In one embodiment, a cell library maintains a plurality of gates and a plurality of layout rules for the circuit design and at least one of the layout rules is based on a reliability verification constraint. One example of a layout rule based on a reliability verification constraint is the specification of a maximum current that a wire of a given width can carry based on electromigration constraints. Another example of such a rule is the specification of a maximum current density for a wire of a given width due to self-heat constraints. These rules are specified for one or more of the metal layers available for interconnection. Alternate embodiments having additional or differing layout rules are contemplated as within the scope of the invention. For example, some embodiments have layout rules based on other reliability phenomena such as thermal cracking of polysilicon, latch-up issues and maximum current per contact. Likewise, some embodiments have additional layout rules based on traditional layout constraints such as density constraints, aspect ratio constraints, or routing complexity constraints.

The processing modules 404 comprise program modules that perform the functions of a computer automated placement tool. Generally, program modules include routines, programs, objects, components, data structures, etc., that perform particular functions or implement particular abstract data types. In one embodiment, the processing modules 404 receive the circuit design in the form of a net list. The processing modules place the components of the circuit design in a layout and the processing modules analyze the placement for compliance with the layout rules based on reliability verification constraints. One output 406 of the computer automated placement system 400 is a layout for the integrated circuit that complies with the layout rules based on the reliability verification constraints received as inputs. In one embodiment, wires are routed between the plurality of gates in the layout of the integrated circuit using any commonly available routing tool software.

Additional inputs, functions of the processing modules, and outputs will be readily apparent from the following detailed description.

Methods of the Invention

In the previous section, a system level overview of the operation of an example embodiment of the invention was described. In this section, the particular methods performed by a processor, such as the processor 302 of FIG. 3, in an example embodiment are described by reference to a series of flowcharts and diagrams. The methods to be performed constitute computer programs made up of computer-executable instructions. The methods shown in FIGS. 5–16 are implemented in connection with a machine readable medium comprising machine readable instructions for causing a computer to perform the method. Such machine readable medium may include software modules and computer programs. The computer programs comprise multiple modules or objects to perform the methods, or the functions of the processing modules in the computer automated placement system of FIG. 4. The type of computer programming languages used to write the code may vary from procedural code type languages to object oriented languages. The files or objects need not have a one to one correspondence to the modules or method steps described depending on the desires of the programmer. Further, the method and apparatus may comprise combinations of software, hardware and firmware. Describing the methods by reference to flowcharts enables one skilled in the art to develop such programs including such instructions to carry out the methods on suitable computerized systems.

A major drawback of current placement methods is that the techniques focus on high layout density and ignore reliability verification (RV) constraints. Significant redesign effort is saved by considering RV constraints during the layout of a circuit design. The novel placement methods of the present invention consider reliability verification constraints in addition to traditional metrics such as width minimization and wiring cost. In one embodiment, the placement methods minimize reliability verification concerns arising from electromigration and self heat while simultaneously achieving a high layout density. The placement methods described in this section also make use of rows that have non-uniform sizes and are overlapping. This produces a result that is closer to manual layout than the pseudo 2-dimensional methods currently available. According to one embodiment of the present invention, the placement method consists of three main operations: (1) clustering of components, (2) generating the layouts for these clusters, and (3) placing the various layout clusters relative to each other.

Figure 5:
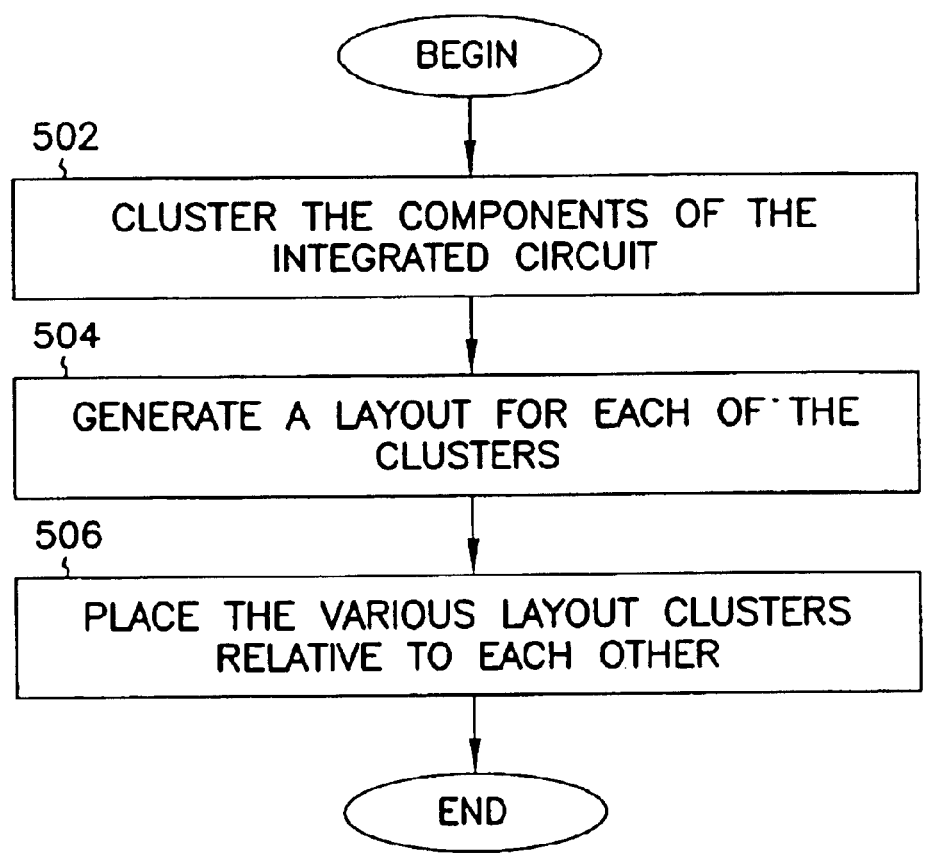
FIG. 5 is a high level flowchart of a method of placing components of an integrated circuit in a layout according to one embodiment of the present invention.

FIG. 5 is a high level flowchart of a method of placing components of an integrated circuit in a layout according to one embodiment of the present invention. As shown in FIG. 5 the method begins by clustering the components of the integrated circuit (block 502). In one embodiment, clustering is performed based on an analysis of a circuit design received in the form of a net list. After clustering the components of the integrated circuit, layouts are generated for each of the clusters (block 504). Then the various layout clusters are placed relative to each other in a layout for the integrated circuit (block 506). A novel cost function is used to evaluate the resulting layout for the integrated circuit. The cost function considers reliability verification constraints and is further described below. The following sections further elaborate on blocks 502, 504 and 506 of FIG. 5.

Clustering of the Components.

As schematics get larger it is often desirable to break up the schematic into smaller segments to keep the complexity manageable. One method of breaking up the schematic is referred to as clustering. The purpose of clustering is to break up a schematic into a set of strongly connected transistors according to a desired gate ordering style. For any cell library, sets of layout architecture rules dictate the desired gate ordering style.

Figure 6:
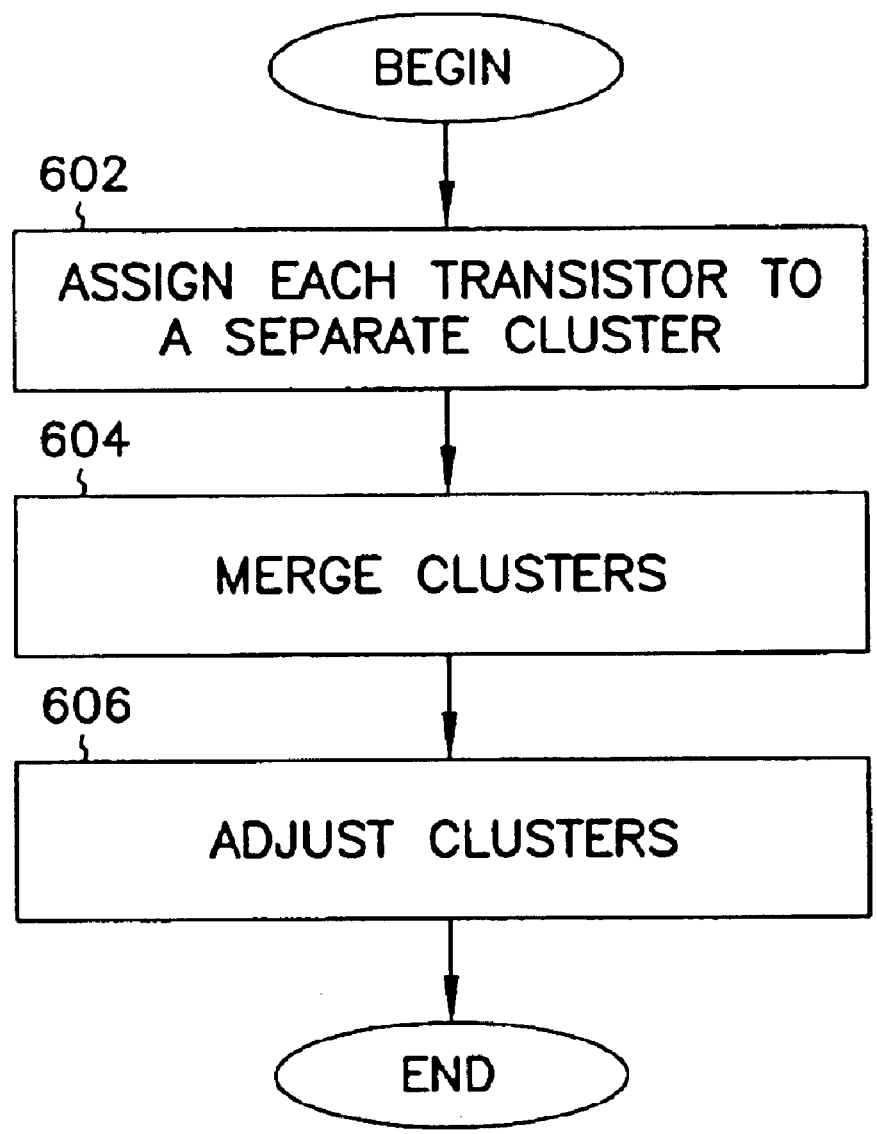
FIG. 6 is a more detailed flow chart of the "Cluster the components . . . " block of FIG. 5 according to one embodiment of the present invention.

FIG. 6 is a more detailed flow chart of the "Cluster the components . . . " block of FIG. 5. As shown in FIG. 6, clustering begins by assigning each of the transistors to one of a plurality of clusters (block 602). After the transistors are assigned to clusters, the clusters are merged according to a desired gate ordering style (block 604). In some embodiments, the clusters are adjusted after they are merged (block 606). For example, the clusters may be adjusted to comply with various layout constraints or to equalize stack legs. The operations in block 604 and 606 of FIG. 6 are now described in more detail.

As shown in FIG. 6, after each transistor is assigned to a cluster, the clusters are merged according to a desired gate ordering style (block 604). In one embodiment, the clusters are merged based on a lumped gate ordering style or a distributed gate ordering style. However, the invention is not limited to lumped or distributed gate ordering styles. Alternate embodiments having additional or differing gate ordering styles are contemplated as within the scope of the invention.

For a lumped gate ordering style, clusters with legs from the same transistors are merged together. The lumped gate ordering style is used when the electromigration rules for the operating frequency allow abutment of transistors legs with the same gate net. Lumped gate ordering is used because it saves a significant amount of routing area for the input signals. However, in a high-frequency cell library, transistor legs with similar gate nets cannot be placed together due to electromigration from increased strap currents. However, a distributed gate ordering style is used where two abutting transistors usually do not have the same gate net. For a distributed placement style, the clusters are merged on a net-by-net basis. For each net except power and ground, all clusters with devices whose sources or drains connect to this net are conditionally merged. In most cases, each one of the resulting clusters obtained corresponds to a logic gate in the circuit design.

However, devices with a large size mismatch should not be merged during clustering. In one embodiment, an input parameter, $\lambda$, is defined to quantify this size mismatch. If the ratio of the width of device from the new cluster to the width of the largest device in the current cluster is larger than 1 or smaller than $1/\lambda$, then the two clusters should not be merged. Otherwise, the final result of placement will not be optimal since the abutment of transistors not matched in width is a potential waste of cell area. However, one exception is the transmission gate.

In some embodiments, after the clusters are merged, the clusters are adjusted (block 606). For example, the clusters may be adjusted to comply with various architecture layout rules or layout constraints. For example, fabrication processes may limit the maximum size of a device that can be manufactured reliably. In cases where the schematic devices need to be larger than the size allowed by the layout constraints, transistors are folded into multiple legs to comply with the size limits.

Figure 7A:
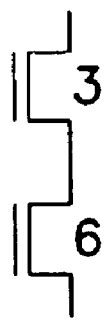
FIGS. 7A, 7B, 7C, 7D, 7E and 7F are schematic diagrams of transistors in a cluster used to illustrate various folding schemes.
Figure 7B:
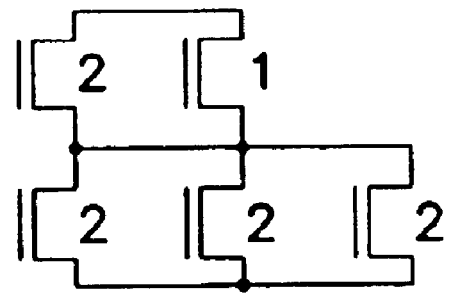

Some examples of folding schemes are described by reference to FIGS. 7A, 7B, 7C, 7D, 7E, 7F, and 7G which are schematic diagrams or layout diagrams of transistors in a cluster. In the example embodiments shown in FIGS. 7A, 7B, 7C, 7D, 7E, 7F and 7G the maximum device size allowed by the layout constraints is two microns ($2\mu$). The example shown in FIG. 7A is a diagram of cluster having a transistor with a width of six microns ($6\mu$) and a transistor with width of three microns ($3\mu$). Both devices shown in FIG. 7A exceed the maximum device size allowed for the cluster. Accordingly, the size of devices in the cluster is adjusted as shown in FIG. 7B to comply with the layout constraints. In the example embodiment shown in FIG. 7B, the folding scheme applied is referred to as "device-based legging." Device-based legging is the process by which transistors whose width exceeds the process limit are folded into smaller legs by a simple modulus operation. The modulus procedure for device-based legging is given below:

```
remainingWidth = size of given transistor
maxLimit = Maximum transistor size
placedWidth = width of each new transistor leg
While (remainingWidth > maxLimit) {
    placedWidth = maxLimit;
    remainingWidth = remainingWidth − maxLimit;
}
```

While folding transistors, the algorithm also needs to make sure it is design rule correct and that the necessary add-on values (if any) for device legging are also considered. Thus, in device-based legging, transistors are folded solely based on the process limit and considerations of overall circuit structure do not come into the picture at all. The example shown in FIG. 7B, illustrates a device-based legging folding scheme. As shown in FIG. 7B, the device with a width of six microns ($6\mu$) (in FIG. 7A) has been folded into three legs of two microns ($2\mu$) each. The device with a width of three microns ($3\mu$) (in FIG. 7A) has been folded into one leg of two microns ($2\mu$) and one leg of one micron ($1\mu$).

Figure 7C:
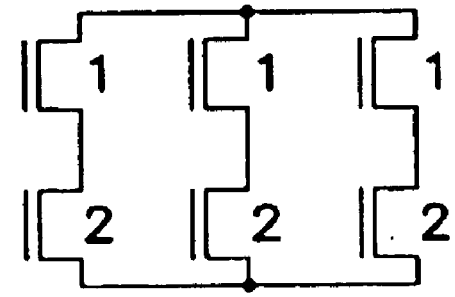

Re-legging of a device is advantageous for reasons other than complying with size constraints. For example, consider a circuit having a stack of transistors having different widths such as the circuit shown in FIG. 7A. When the transistors are placed, metal tracks have to be allocated to route the internal nodes after placement. By introducing additional device folding, the number of legs can be equalized across all stacked devices as shown in FIG. 7C. In this example, device folding eliminates the need for routing the internal nodes, and should be used whenever such a gain is estimated to be higher than the cost of folding. This scheme is referred to as "stack-based legging." Stack-based legging refers to the folding of transistors in a way that preserves the regularity of the circuit topology. Transistors are folded not in isolation, but with consideration with respect to the overall circuit structure. This difference is illustrated by comparing FIGS. 7A, 7B and 7C. FIG. 7C preserves the regularity of the circuit structure of 7A and thus is an example of stack-based legging. In contrast, FIG. 7B does not preserve the regularity of the circuit structure of FIG. 7A since the transistors are folded in isolation and without regard to other transistors in the circuit.

Several other layout considerations also determine how and when schematic devices should be legged before placement. In another example embodiment, the placement method of the present invention performs a scheme referred to as "differential-legging" to generate stacks of devices with notches designed for well taps, substrate taps or input pins. Differential legging refers to the process of artificially creating a small transistor during the transistor legging process. The notch created in the layout due to this small transistor can be used to insert objects (such as input pins, substrate taps, input protection diodes etc.) which otherwise may have been difficult because of lack of convenient notch area in the layout.

Figure 7D:
Figure 7E:
Figure 7F:
Figure 7G:
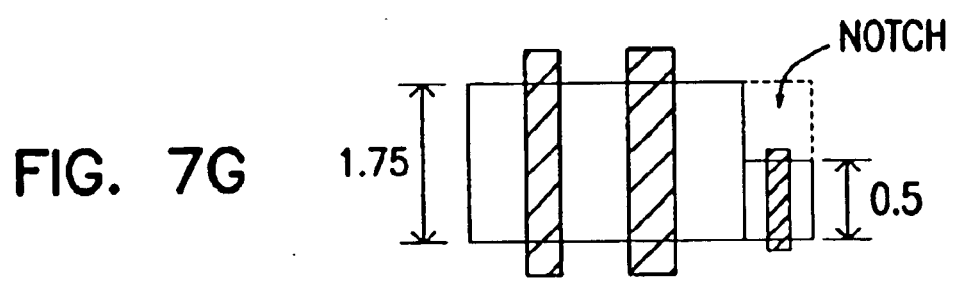
FIG. 7G is a diagram of the physical layout for the schematic in FIG. 7F.

The following example compares device-based legging to differential legging. With a process legging limit of two microns ($2\mu$), a device with a width of four microns ($4\mu$) as shown in FIG. 7D is folded into two legs of two microns ($2\mu$) each as shown in FIG. 7E by the device-based legging scheme. In contrast, using differential legging the same device is folded into two legs of one-and-three-fourths microns ($1.75\mu$) each and one leg of one-half micron ($0.5\mu$) as shown in FIG. 7F to create a notch for taps or input pins. The smaller transistor shown in FIG. 7F creates a notch in the physical layout. The physical layout for the schematic in FIG. 7F is illustrated in FIG. 7G.

In one embodiment of the present invention, the layout production environment uses a Cell Architecture Rules Language for describing the various knobs that control device legging to the placement algorithm. The Cell Architecture Rules Language is further described in B. Basaran et al., "GeneSys—A Leaf-Cell Layout Synthesis System for GHz VLSI Designs," *Proc. 12th International Conference on VLSI Design*, pp. 448–452 January 1999.

Generation of Cluster Layouts.

A method of clustering the components of the integrated circuit according to one embodiment of the present invention has been described. This section further describes a method of generating a layout for each one of the clusters as referred to in block 504 of FIG. 5.

According to conventional methods, a Euler-path technique is used for the generation of a layout from clusters of a schematic. However, the Euler-path technique does not take into account reliability verification constraints when generating the layout for the cluster of the schematic. The present invention uses a novel method of generating a layout for a cluster ("cluster layout") that takes into account reliability verification constraints as well as traditional constraints such as diffusion sharing and gate ordering for a wide variety of circuit types.

The following section describes an example embodiment of a method of generating a cluster layout for combinational circuit designs such as fully complementary CMOS circuits. However, the invention is not limited to layout generation for combinational circuit designs. Layout generation for other types of circuit designs such as domino and pass-gate logic are contemplated as within the scope of the invention. For example, the method can be applied to domino logic by treating the N- and P-parts independently of each other and adding noise constraints to the clustering and simulated annealing cost functions.

Figure 8:
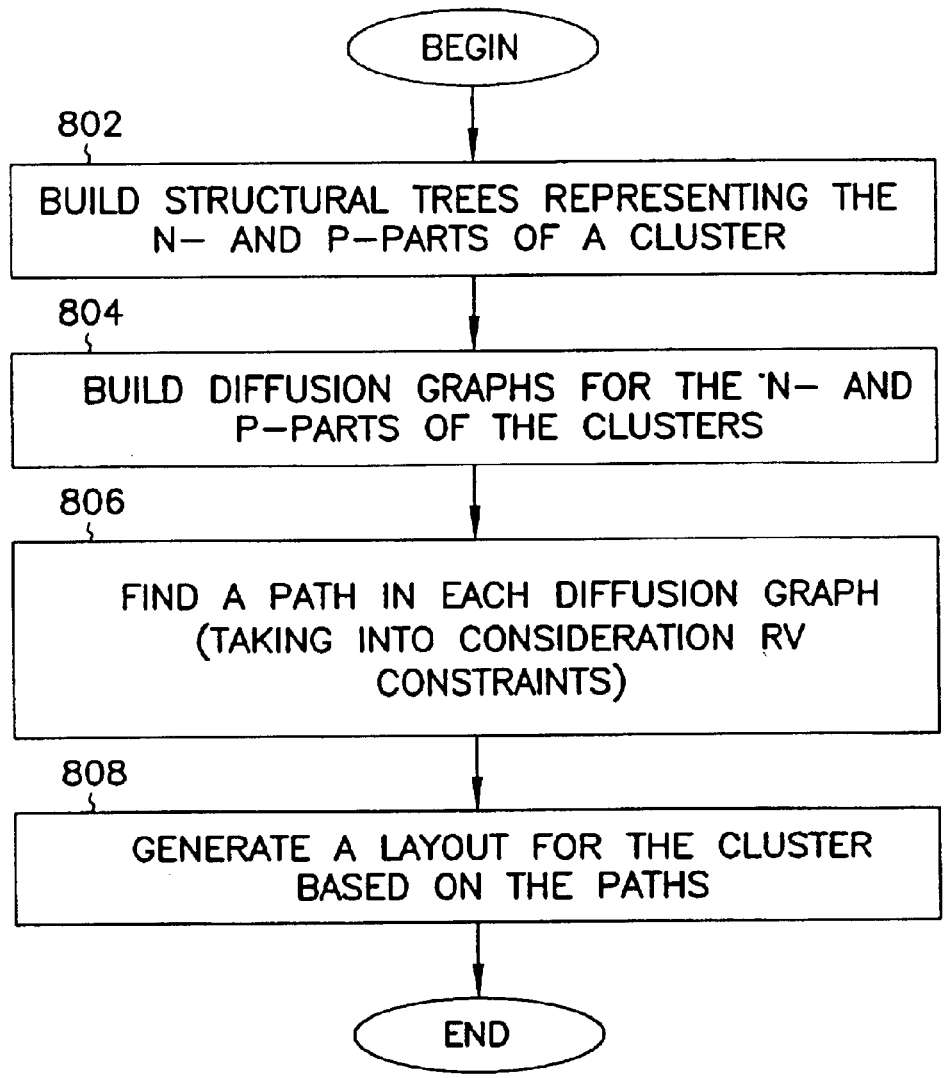
FIG. 8 is a more detailed flow chart of the "Generate a layout . . . " block of FIG. 5 according to one embodiment of the present invention.

FIG. 8 is a more detailed flow chart of the "Generate a layout for each one of the clusters" block of FIG. 5 (block 504). As shown in FIG. 8, the method of generating a layout begins by building a structural tree representing the N- and P-parts of the cluster (block 802). The structural trees are used to build a diffusion graph for the N- and P-parts of the cluster (block 804). Methods of building the structural trees and building the diffusion graphs are known in the art. Next, the method includes finding a path in the diffusion graph (block 806). The operation of finding a path takes into consideration RV constraints and is described in more detail below. The resulting path corresponds to the order of the transistors in the layout for the cluster. A layout is generated for the cluster based on the paths (block 808). The operations shown in the flow chart of FIG. 8 are further illustrated by the following example described by reference to FIGS. 9, 10A, 10B, 11A, 11B, 12A, 12B and 12C.

Figure 9:
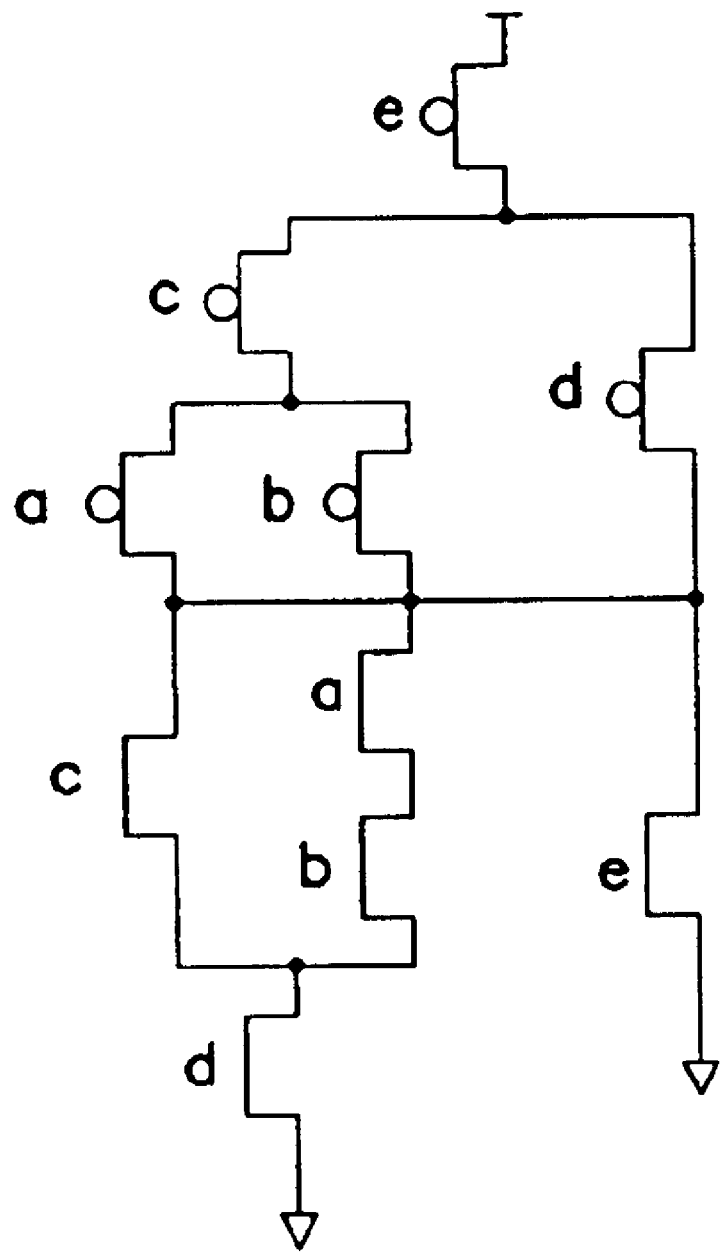
FIG. 9 is as a diagram of a cluster of transistors generated according to block 502 of FIG. 5.

FIG. 9 is as a diagram of a cluster of transistors generated according to block 502 of FIG. 5. FIGS. 10A and 10B are structural trees for the N- and P-parts of the cluster shown in FIG. 9. The structural tree, TP, shown in FIG. 10A, represents the hierarchical structure of the P-parts of the cluster shown in FIG. 9. The structural tree, TN, shown in FIG. 10B, represents the hierarchical structure of the N-parts of the cluster shown in FIG. 9. As shown in FIGS. 10A and 10B, the leaf vertices 1002, 1006 of the trees correspond to the devices in the cluster. The other vertices 1004, 1008 correspond to a connection type, either parallel (P) or series (S), of the children of the other vertices 1004, 1008. The structural trees are constructed separately for the N and P clusters. The structural trees are used for estimations of routing length and pairing corresponding P and N transistors.

In an example embodiment of the invention, the children of every vertex in the structural trees TP and TN, as shown in FIGS. 10A and 10B respectively, are ordered as follows:
 a) If the vertex is a series vertex, the order of its children is the order of the corresponding devices in the stack.
 b) If the vertex is a parallel vertex, then there is a dual vertex in the complementary tree which is a series vertex. The order of its children coincides with the order of the children of the dual vertex.

FIG. 11A is a diffusion graph DP for the P-parts of the cluster shown in FIG. 9. A diffusion graph DN is also created for the N-part of the cluster, but is not shown here. Each edge (i.e. line) in the diffusion graph corresponds to one of the transistors in the P-part of the cluster shown in FIG. 9. The methods of creating diffusion graphs are known in the art.

FIG. 11B is the diffusion graph DP, as shown in FIG. 11A, with arrows on the edges to indicate a path. The identified path is used to create the layout of the P-part of the cluster shown in FIG. 9. In one embodiment, the path is identified by modifying a Flery algorithm of finding a Euler path in a graph as described below. To find the path, begin by selecting an arbitrary vertex of the diffusion graph that satisfies the following criteria:
 a) The vertex has the maximum odd degree.
 b) Prefer odd-degree power node to a odd-degree non-power node. Odd-degree vertices are preferred since they enable traversal out of the vertex without diffusion breaks.
 c) If no odd degree node exists, then prefer a power node over a non-power node. Power nodes are preferred at the outer ends to reduce signal capacitance.
 d) The vertex does not correspond to an internal net, since such a net will have to be routed if it is on the outer edges of a cluster.

Selecting different vertices allows the generation of different layout implementations of the same cluster. After selecting an arbitrary vertex, let w be the vertex of the diffusion graph that has been reached and k be the number of the last edge that has been marked (initially k=0). Select the next edge of the diffusion graph according to the following rules:
 a) Select a bridging edge only if there is no other choice.
 b) When there is a choice between multiple non-bridging edges, then use the following rules in the given precedence:
  1) Select a gate net based on electromigration constraints. (An example is described below.)
  2) Select an edge which will ensure the same order of P and N transistors. This information is obtained from the complementary structural tree.
  3) Select an edge which is nearest to current node in the structural tree, to minimize routing requirements The application of the novel rule of selecting a gate net based on electromigration constraints in (b)(1) above is illustrated with the following example. Consider a 4-input NAND gate cell. Let each of the input signals (a, b, c, d) connect to three legs of PMOS and NMOS transistors each. If the target frequency for the library is high enough, then the layout must be strongly driven by electromigration concerns. Therefore, to reduce strap currents, the following gate orderings will be preferable:

(abcddcbaabcd) or (abcdabcdabcd)

Whereas if the current values are not significant enough, as in a lower frequency library, the current values allow for lumping similar gate nets together, as in:

(aaabbbcccddd)

An overall area reduction is possible in this case, even with potential difrusion breaks. This is because all the inputs can be routed with one metal track in most cases (assuming a single row placement for the cluster).

Depending on particular layout design style and process reliability verification constraints, the placement algorithm is able to adapt to varying requirements on gate ordering. Another common gate-ordering scheme that shares routing tracks on input signals is:

(abababcdcdcd)

Referring back to FIG. 11B, an example path goes through N2, N3, N2, N1, N3. This path goes through a, b, c, and d but not e due to diffusion break. Based on this path, the order of the transistors for the P-part of the cluster is a, b, c, d and e for the above example.

After generating the layouts for all clusters, some clusters can be potentially very long compared to others. In such cases, the placement of layout clusters relative to each other as described in the next section becomes easier if the long clusters are broken up into smaller chunks, as illustrated by reference to FIGS. 12A, 12B and 12C.

Figure 12A:
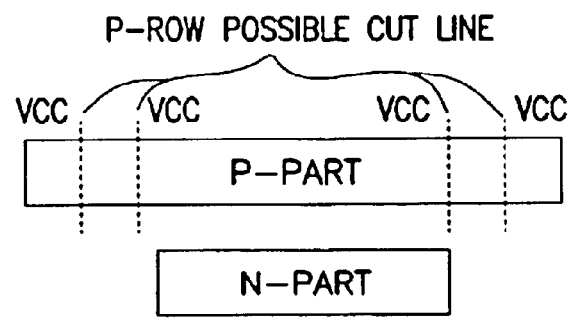
FIGS. 12A, 12B and 12C are diagrams of the P-part and the N-part of a cluster.
Figure 12B:
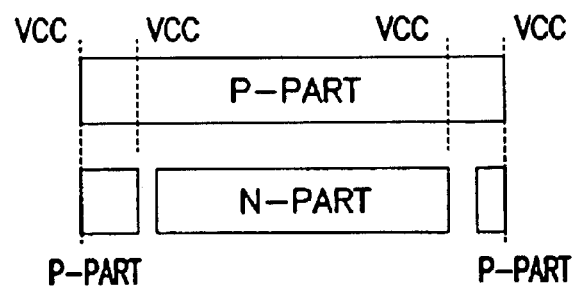
Figure 12C:
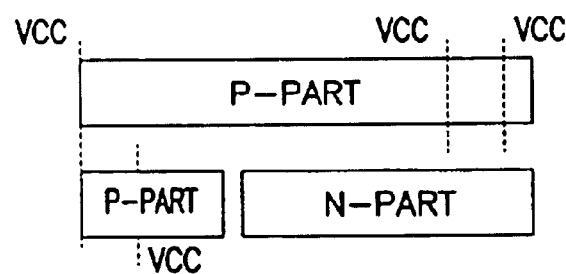

As shown in FIG. 12A, the row for the P-part of the cluster is much longer than the row for the N-part of the cluster. In this case folding is done to equalize the size of the rows. The stacks of devices are usually allowed to split on the power and ground nets only, since the increase in nodal capacitance is generally allowed only for non-switching nodes. Four possible row cutting lines are indicated in FIG. 12A. FIGS. 12B and 12C illustrate two example ways to fold the P-part of the cluster. As shown in FIG. 12B, the P-part is folded at the left and right-most VCC lines and the corresponding portions of the P-part are placed on the left and right end of the N-part. As shown in FIG. 12C, the P-part is folded at one of the VCC lines on the left side and the corresponding portion of the P-part is placed on the left end of the N-part.

Placement of Cluster Blocks.

A method of generating a layout for each one of the clusters according to one embodiment of the present invention has been described. This section farther describes a method of placing the various layout clusters relative to each other as referred to in block 506 of FIG. 5.

Once the various clusters have been generated and a layout produced for each cluster according to block 502 and block 504 of FIG. 5, an iterative improvement technique is used to place the clusters relative to each other. In one embodiment, while placing the clusters relative to each other, the novel placement method of the present invention address the following concerns: (1) reduction of current density to minimize RV problems and (2) packing of the clusters in a true 2-dimensional manner.

Figure 13:
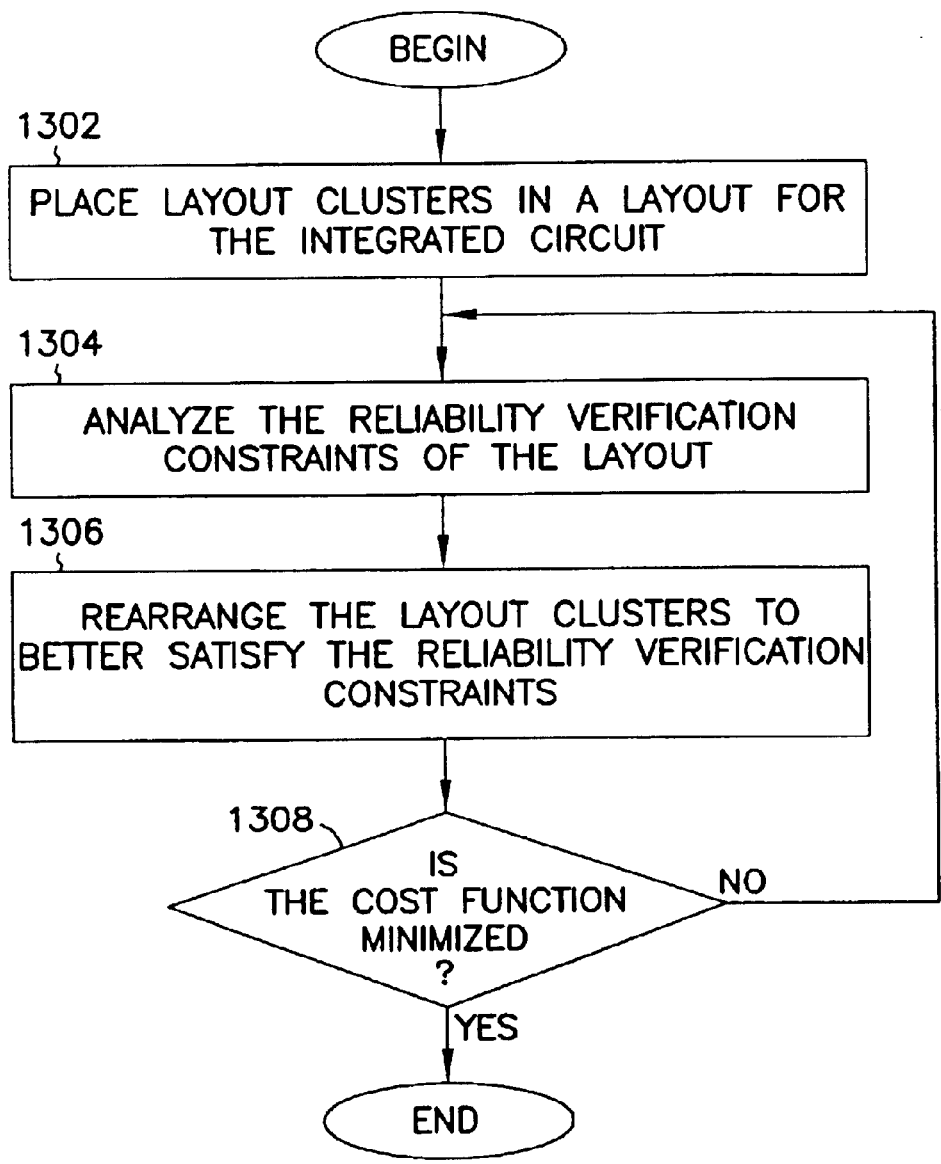
FIG. 13 is a more detailed flow chart of the "Place the various layout clusters . . . " block of FIG. 5 according to one embodiment of the present invention.

FIG. 13 is a more detailed flowchart of the "Place the various layout clusters relative to each other" block of FIG. 5 (block 506). As shown in FIG. 13, the method begins by placing the various layout clusters in a layout for the integrated circuit (block 1302). In one embodiment, the layout is performed in a 2-dimensional manner as further described below. Then, the reliability verification constraints are analyzed for the layout of the integrated circuit (block 1304). In one embodiment, the analysis includes calculating a cost function having a reliability verification factor representing the effects of self-heat and electromigration. One objective of the method shown in FIG. 13 is to minimize such a cost function and thus minimize reliability verification concerns arising from electromigration and self heat. To further minimize the cost function and improve the final layout, the layout clusters may be rearranged (block 1306). Perturbation functions used to rearrange the layout are further described below. In one embodiment, the process shown in block 1304 and block 1306 is repeated until the cost function has been minimized as desired (block 1308). In some embodiments, the layout is also analyzed at block 1304 for traditional constraints such as layout density constraints, aspect ratio constraints, and routing complexity constraints.

In one embodiment, the operations of placing the clusters (block 1302 of FIG. 13) and rearranging the clusters (block 1306 of FIG. 13) are performed in a 2dimensional manner. The novel cluster placement method of the present invention models uses multiple overlapping rows to guide the placement of the clusters in a 2-dimensional manner. The row widths are generated based on the widths of the clusters. There are several ways of breaking an area, or placement space, into multiple overlapping rows. An example embodiment uses the width of the smallest cluster to partition entire cell width into rows that have widths which are integer multiples of this width.

Figure 14:
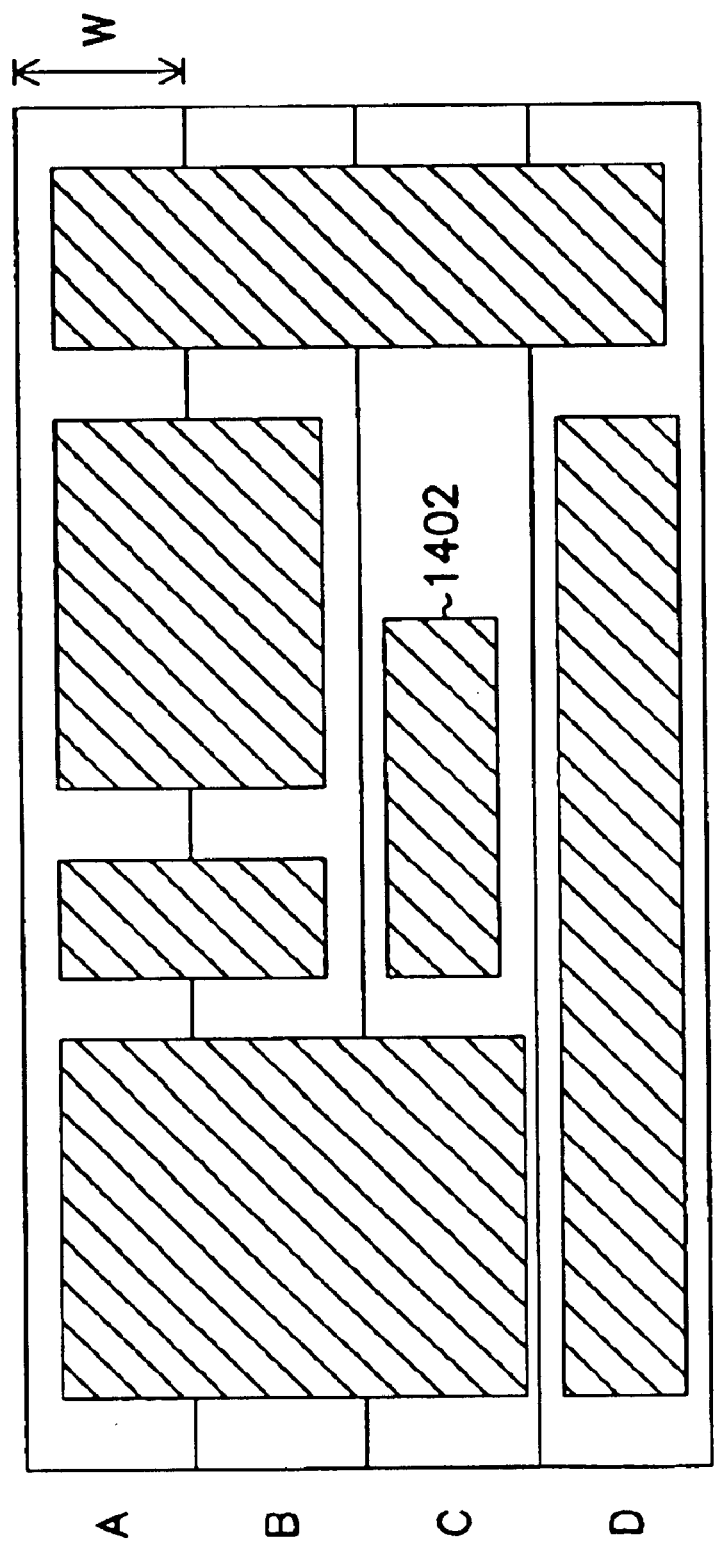
FIG. 14 is a block diagram of a 2-dimensional layout space having overlapping rows according to one embodiment of the invention.

FIG. 14 is a block diagram of a 2-dimensional layout space having overlapping rows according to one embodiment of the invention. The width (w) of the rows in the layout shown in FIG. 14 are multiples of the width of the smallest cluster 1402. The layout space shown in FIG. 14 has ten rows comprised of four rows of width W (row A, row B, row C, row D), three rows of width 2W (row AB, row BC, row CD), two rows of width 3W (row ABC, row BCD) and one row of width 4W (row ABCD). Such an overlapping scheme of rows allows a dense placement of clusters that are mismatched in their widths In one embodiment, the operations shown in FIG. 13 are implemented with a simulated annealing algorithm such as the following example simulated annealing algorithm:

```
1  temp = INIT_TEMP
2  place = INIT_PLACEMENT
3  while (temp > FINAL_TEMP) do {
4    while (inner_loop_criterion = FALSE) do {
5      new_place = PERTURB(place)
6      ΔC = COST(new_place) − COST(place)
7      if (ΔC<0 or RANDOM(0, 1) > e^{ΔC/T} then
8        place = new_place;
9      temp = SCHEDULE(temp);
10   }
11 }
```

Previous cluster placement algorithms using simulated annealing focused on optimizing diffusion gaps and wire lengths. In contrast, reliability verification constraints are analyzed with a novel simulated annealing cost function of the present invention in addition to traditional metrics such as cell area, wire-length and number of diffusion breaks. In one embodiment of the present invention, the simulated annealing cost function is set up to bias the topology towards a gate ordering that minimizes overall current density and thus reduces the effects over time of reliability phenomena such as electromigration and self heat.

In an example embodiment, the simulated annealing cost function is selected such that it optimizes all the variables of interest. According to one embodiment of the present invention, the structure of the cost function used is as follows:

$$\text{Cost function} = k_{CA}F_{CA} + k_{WL}F_{WL} + k_{DB}F_{DB} + k_{RV}F_{RV} + k_{TB}F_{TB}$$

The cost function is a weighted sum of five different components. The example cost function provided above includes traditional metrics such as cell area ($F_{CA}$), wire-length estimation ($F_{WL}$) and the number of diffusion breaks ($FD_{DB}$). The example cost function defined above also includes two new and useful measures of quality, namely, RV constraints ($F_{RV}$) and terminal blockage estimation ($F_{TB}$).

The success of a simulated annealing cost function is influenced by the selection of the weights ($k_{CA}$, $k_{WL}$, $k_{DB}$, $k_{RV}$ and $k_{TB}$) that normalize the five cost components. A variety of factors determine the selection of weights in the simulated annealing cost function. In one embodiment, if the layout architecture is heavily driven by reliability constraints, then the reliability weights are increased relatively to reflect this. In another embodiment, the desired layout architecture is studied and several representative cells are passed through this algorithm. The initial weights are determined by theoretical calculations, and then the weights are adjusted using the experimental data obtained from the representative cells. Such experimentation can produce several sets of weight factors, each of which are categorized as being useful for a particular family of input data.

A bounding box of all transistor clusters provides a quick estimate of the net cell area, $F_{CA}$. The wiring cost $F_{WL}$ can be approximated by using a standard Steiner-tree estimation procedure with optional qualifiers for special nets. For example, the routing topologies for certain nets may be known in advance from the layout architecture rules and those may be calculated separately from the other nets. The Steiner-tree estimation procedure is further described in J. M. Ho et al., "A New Approach to the Rectilinear Steiner Tree Problem," *IEEE Transactions on Computer-aided Design,* 9(2), pp. 185–193, February 1985. Before computing the number of diffusion breaks $F_{DB}$, the placement is compacted by abutments of adjacent clusters through diffusion sharing wherever possible.

In one embodiment, the total RV cost is represented in the following way:

$$F_{RV}=f_1(\text{electromigration})+f_2(\text{self-heat})$$

A method of computing the electromigration cost of the total RV cost, $f_1$(electromigration), is now described according to one embodiment of the present invention. The goal of the electromigration cost function is to reduce the unidirectional current density across all cut lines of the circuit. Let $c(l,n)$ denote the fraction of average current corresponding to gate net n through the arbitrary vertical cut-line l across the circuit. The overall unidirectional current density cost is taken as the maximum value of $c(l,n)$, summed across all nets for all possible cut-lines as follows:

$$F_{RV}(\text{electromigration})=\max_l(3_n c(l,n))$$

In one embodiment, the following notation is used to obtain a polynomial expression for $c(l,n)$. Let $pd_{left}(l,n)$ be the number of PMOS transistors with gate signal n on the left side of the line l, and $pd_{right}(l,n)$ be the number on the right side of the line l. Let the corresponding numbers for the NMOS devices be $nd_{left}(l,n)$ and $nd_{right}(l,n)$. Then define the total currents for each part as the following:

$$nd(n)=nd_{left}(l,n)+nd_{right}(l,n)$$

$$pd(n)=pd_{left}(l,n)+pd_{right}(l,n)$$

Then $c(l, n)$ is be defined as the absolute value of $$(nd_{left}(l,n)/nd(l,n)-pd_{left}(l,n)/pd(ln))$$

or $$(nd_{right}(l,n)/nd(l,n)-pd_{right}(l,n)/pd(ln))$$

This is the fractional unidirectional load on the horizontal wire segment connecting the left and right parts of the circuit. The method allows incremental calculation, which is essential in any iterative algorithm.

Figure 15:
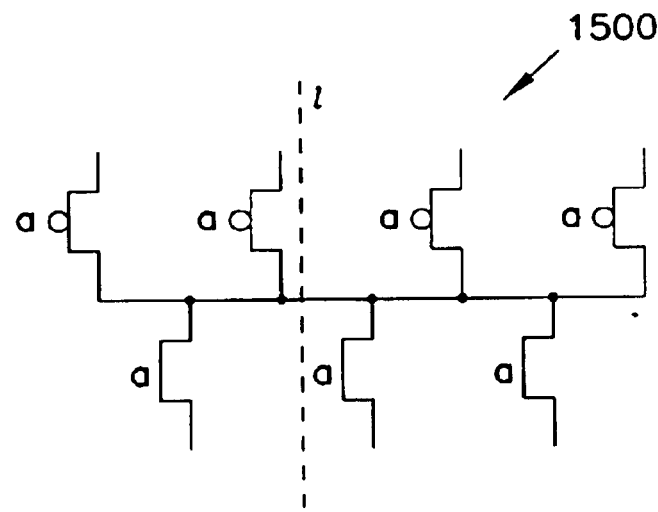
FIG. 15 is a diagram of a circuit segment used to illustrate an example method of computing an electromigration cost function.

FIG. 15 is a diagram of a circuit segment 1500 used to illustrate an example method of computing an electromigration cost function. The following example illustrates the method of computing the electromigration cost $f_1$(electromigration). The line l divides the circuit segment 1500 into a left and a right part for the following calculations. In this example, let $pd_{left}(l,a)=2I$, $pd_{right}(l,a)=2I$, $nd_{left}(l,a)=I$, and $nd_{right}(l,a)=2I$. Hence $nd(a)=3I$ and $pd(a)=4I$.

$$c(l, n) = \left|\frac{1}{2} - \frac{1}{3}\right| = \left|\frac{1}{2} - \frac{2}{3}\right| = \frac{1}{6}$$

In alternate embodiments, enhancements to this basic model may be made to make this model support various other factors such as the long and short metal electromigration rules, fudge factors for various rush-through currents etc.

The total RV cost $F_{RV}$ includes the self-heating cost in addition to the electromigration cost. In one embodiment, a similar model can be applied to compute $f_2$(self-heat). The self-heat analysis is concerned with modeling the bidirectional currents on all segments. Unlike the unidirectional currents, the port locations on the input and output nets are needed to estimate what the various branch currents are. Port locations are points where the cell can be connected to the next level of hierarchy. A single net may have more than one port location in order to provide the higher-level router with more flexibility. All nodes on the input and output nets are considered to be port locations, one at a time, to determine the worst-case scenario. Even though the cell may be connected at multiple points, the analysis considers only one node per port, since connections at multiple nodes will reduce the currents carried by the branches anyway.

Figure 16:
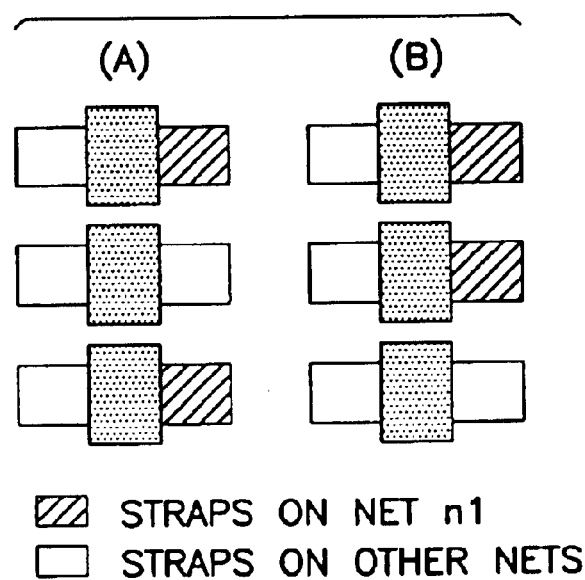
FIG. 16 is a diagram of transistors used to illustrate an example of terminal blockage.

In one embodiment, the novel cost function also includes terminal blockage estimation ($F_{TB}$). FIG. 16 is a diagram of transistors used to illustrate an example of terminal blockage. Consider the transistor arrangement given in (A) of FIG. 16. The transistor in the middle prevents direct connection between the metal straps on net nl. This arrangement blocks two routing tracks for routing the same net. If all other factors remain same, then the placement given in (B) of FIG. 16 is a better choice, since the net nl can be routed using a single routing track instead of two. This problem is quite common in true 2-dimensional layouts, such as those of sequential cells. This problem can be conveniently dealt with during simulated annealing.

In an example embodiment, the terminal blocking cost $F_{TB}$ is as follows:

(a) Initialize $F_{TB}=0$.

(b) For each terminal, stretch its bounding box in the preferred routing direction till it intersects the cell boundary. Count the number of polygon intersections with other terminals on the same layer and net, and add it to $F_{TB}$.

Alternate embodiments having more complex definitions of terminal blockage that take into account allowed interconnect jogging, track estimations, special terminal blockage considerations power and ground signals etc. are contemplated. The terminal blocking costs is independent of the wire length cost, since it is possible to use the same length of wire and block varying amounts of tracks on metal lines depending on the preferred routing direction and how the wires are laid out.

In one embodiment, the operation rearranging the clusters (block 1306 of FIG. 13) consists of three types of moves—flipping of clusters, swapping of clusters and exploration of different cluster implementations. To implement a flipping move, a randomly picked cluster is flipped about the vertical axis. The potential payoffs of this move are better diffusion sharing and improved routing. To implement a swapping move, the positions of two randomly picked clusters are interchanged. In the case of a pure 1-dimensional or pseudo 2-dimensional placement, the rows do not overlap each other. Hence, in such a situation, swapping of two clusters will only require insertion of blocks in isolated rows. Since the rows overlap in some embodiments of the present invention, insertion of a cluster in a row can potentially conflict with clusters in the other rows. Simple heuristics are used to resolve such conflicts by moving the interfering clusters either to the left or to the right. Besides the flipping and swapping moves, the perturbation function also explores different layout implementations of the same cluster.

One embodiment of a method of placing the various layout clusters relative to each other as referred to in block 506 of FIG. 5 has been described. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A computerized method of placing a plurality of components of an integrated circuit in a layout, the method comprising:
assigning each one of a plurality of components of an integrated circuit to one of a plurality of clusters;
generating a layout for each one of the plurality of clusters;
placing each one of the plurality of clusters in a layout for the integrated circuit wherein the placing is performed in a two-dimensional manner with a plurality of overlapping rows;
performing an analysis of the layout for the integrated circuit using a cost function having a reliability verification factor;
automatically rearranging the layout for the integrated circuit by automatically rearranging the plurality of clusters; and
repeating the analyzing and the rearranging until the cost function is minimized.

2. The computerized method of claim 1, wherein the reliability verification factor represents the effects of electromigration and self heat.

3. The computerized method of claim 2, wherein assigning each one of the components is performed based on a lumped gate ordering style.

4. The computerized method of claim 2, wherein assigning each one of the components is performed based on a distributed gate ordering style.

5. The computerized method of claim 2, further comprising adjusting one or more of the plurality of components in one of the clusters to comply with a size constraint.

6. The computerized method of claim 5, wherein the adjusting is performed using device-based legging.

7. The computerized method of claim 5, wherein the adjusting is performed using stack-based legging.

8. The computerized method of claim 5, wherein the adjusting is performed using differential legging.

9. The computerized method of claim 1, wherein a width of each one of the plurality of overlapping rows is a multiple of a smallest one of the plurality of clusters.

10. A computerized method of creating a layout for a circuit design performed by a computer aided design tool, the method comprising:
receiving a circuit design;
receiving at least one layout rule based on a reliability verification constraint;
assigning each transistor of the circuit design to a cluster, to produce multiple clusters;
generating a cluster layout for each cluster, to produce multiple cluster layouts wherein generating the layout includes arranging the multiple cluster layouts;
generating a circuit layout for the circuit design through computer automated operations;
performing an analysis of the circuit layout to determine whether the circuit layout satisfies the at least one layout rule;
if the analysis indicates that the circuit layout does not satisfy a rule of the at least one layout rule, automatically rearranging portions of the circuit layout, to produce a revised circuit layout; and
repeating the performing and automatically rearranging of the revised circuit layout until the revised circuit layout generated satisfies the at least one layout rule based on the reliability verification constraint received for the circuit design.

11. The computerized method of claim 10, wherein automatically rearranging portions of the layout comprises:
automatically rearranging the multiple cluster layouts.

12. The computerized method of claim 10, wherein assigning each transistor to a cluster comprises:
initially assigning each transistor to a preliminary cluster, resulting in multiple preliminary clusters;
merging the preliminary clusters to produce the multiple clusters; and
adjusting the multiple clusters.

13. The computerized method of claim 10, wherein generating a cluster layout comprises:
building diffusion graphs for portions of the multiple clusters;
finding paths in the diffusion graphs; and
generating the multiple cluster layouts based on the paths.

14. An article comprising:
a computer-readable medium including instructions that when executed cause a computer to:
assign each one of a plurality of components of an integrated circuit to one of a plurality of clusters;
generate a layout for each one of the plurality of clusters;
place each one of the plurality of clusters in a layout for the integrated circuit wherein the placing is performed in a two-dimensional manner with a plurality of overlapping rows;
perform an analysis of the layout for the integrated circuit using a cost function having a reliability verification factor;
automatically rearrange the layout for the integrated circuit by automatically rearranging the plurality of clusters; and
repeat the analysis and the rearrange until the cost function is minimized.

15. The article of claim 14, wherein the reliability verification factor represents the effects of electromigration and self heat.

16. The article of claim 14, wherein a width of each one of the plurality of overlapping rows is a multiple of a smallest one of the plurality of clusters.

17. The article of claim 14, wherein assigning each one of the components is performed based on a lumped gate ordering style.

18. The article of claim 14, wherein assigning each one of the components is performed based on a distributed gate ordering style.

19. The article of claim 14, further causing said computer to adjust one or more of the plurality of components in one of the clusters to comply with a size constraint.

20. The article of claim 19, wherein the adjusting is performed using device-based legging.

21. The article of claim 19, wherein the adjusting is performed using stack-based legging.

22. The article of claim 19, wherein the adjusting is performed using differential legging.

23. An article comprising:
a computer-readable medium including instructions that when executed cause a computer to:
receive a circuit design;
receive at least one layout rule based on a reliability verification constraint;
assign each transistor of the circuit design to a cluster, to produce multiple clusters;
generate a cluster layout for each cluster, to produce multiple cluster layouts wherein generating the layout includes arranging the multiple cluster layouts;

generate a circuit layout for the circuit design through computer automated operations;

perform an analysis of the circuit layout to determine whether the circuit layout satisfies the at least one layout rule;

if the analysis indicates that the circuit layout does not satisfy a rule of the at least one layout rule, automatically rearrange portions of the circuit layout, to produce a revised circuit layout; and repeating the performing and automatically rearranging of the revised circuit layout until the revised circuit layout generated satisfies the at least one layout rule based on the reliability verification constraint received for the circuit design.

24. The article of claim 23, wherein automatically rearranging portions of the layout comprises:

automatically rearranging the multiple cluster layouts.

25. The article of claim 23, wherein assigning each transistor to a cluster comprises:

initially assigning each transistor to a preliminary cluster, resulting in multiple preliminary clusters;

merging the preliminary clusters to produce the multiple clusters; and adjusting the multiple clusters.

26. The article of claim 23, wherein generating a cluster layout comprises:

building diffusion graphs for portions of the multiple clusters;

finding paths in the diffusion graphs; and generating the multiple cluster layouts based on the paths.

* * * * *